United States Patent [19]

Basile

[11] Patent Number: 4,532,433

[45] Date of Patent: Jul. 30, 1985

[54] SWITCHING CIRCUIT WHICH IS SELF-BIASED IN ONE MODE OF OPERATION

[75] Inventor: Philip C. Basile, Turnersville, N.J.

[73] Assignee: RCA Corporation, Princeton, N.J.

[21] Appl. No.: 405,713

[22] Filed: Aug. 6, 1982

[51] Int. Cl.³ .................... H03K 17/56; H03K 17/74
[52] U.S. Cl. .................................. 307/241; 307/244; 307/256
[58] Field of Search ............................ 307/241–244; 333/103, 104

[56] References Cited

U.S. PATENT DOCUMENTS

| | | | |
|---|---|---|---|
| 2,402,625 | 6/1946 | Hoffman | 250/13 |
| 3,041,608 | 6/1981 | Fichter | 343/180 |
| 3,832,647 | 8/1984 | Bearrier | 307/244 |
| 4,223,235 | 9/1980 | Rufray | 307/243 |
| 4,296,414 | 10/1981 | Beyer | 343/5 W |

FOREIGN PATENT DOCUMENTS 46-5883  2/1971  Japan .

OTHER PUBLICATIONS

Electronic Engineering, Semiconductor Diodes for rf Applications, p. 68, Oct. 1977.

*Primary Examiner*—Stanley D. Miller
*Assistant Examiner*—B. P. Davis
*Attorney, Agent, or Firm*—Joseph S. Tripoli; George J. Seligsohn

[57] ABSTRACT

Each of a plurality of circuit paths between a common input terminal and respective output terminals includes a switching device which can be switched between a high and a low impedance state. When a device in one path is switched into its low impedance state in response to a path selection signal, the devices in the remaining paths automatically are switched to their high impedance state in response to a portion of the signal to be passed through the path with the low impedance device. In this way, one of the circuit paths may be selected for coupling the input terminal to a selected output terminal and all other circuit paths are automatically blocked.

9 Claims, 1 Drawing Figure

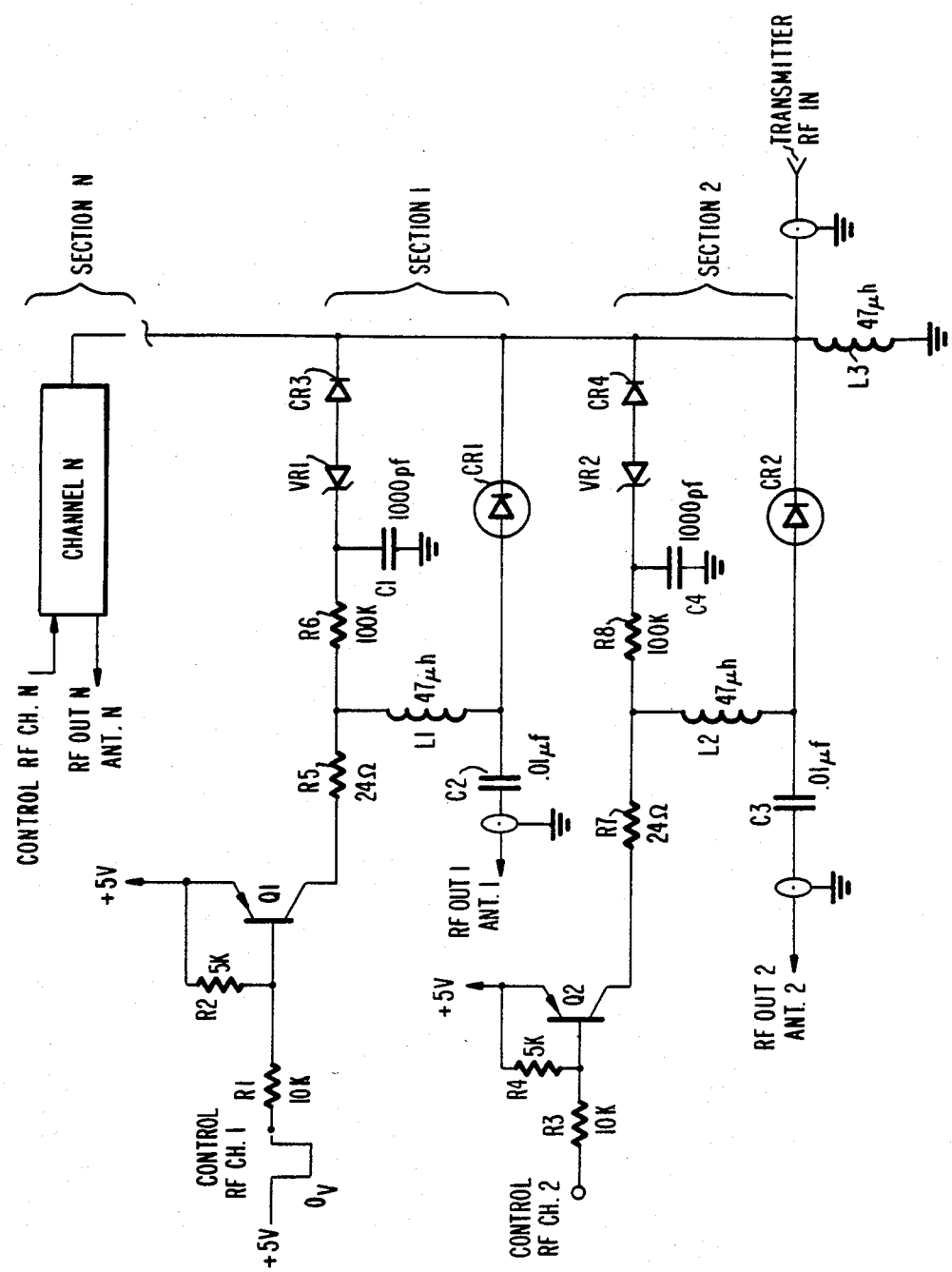

SWITCHING CIRCUIT WHICH IS SELF-BIASED IN ONE MODE OF OPERATION

The present invention relates generally to a switching circuit and more particularly to a switching circuit which is self-biased in one mode of operation.

There are many applications where it is desirable to be able to switch an incoming signal to any one of several output terminals. One example of such a system is a shipboard high frequency (HF) radio system wherein it may be desired to convey a signal to be transmitted to a first antenna positioned in a first location or to a second antenna positioned at another location. For example, the antennas may be located at fore and aft locations on the ship. In the past, electro-mechanical and mechanical type switches have been used to switch a signal to a selected one of a plurality of antennas. These mechanical or electromechanical switches are subject to reliability problems and their switching speed is relatively low. Semiconductor devices, which are fast acting and reliable, therefore often are employed instead.

In radio frequency (RF) systems PIN diodes are becoming popular elements in switching applications. These diodes have a very low forward resistance, (in some cases less than one ohm) with a reasonable forward bias voltage and a very high reverse resistance, (on the order of tens of kilohms) when a fairly large reverse voltage is placed across the PIN diode.

In an HF (2-30 MHz) system PIN diodes require very large reverse bias voltages, especially when operating below 10 MHz. Where the switch is required to transfer, say 1,000 watts of RF power, the reverse bias voltage required for the PIN diode is in excess of $-325$ volts. This large reverse bias voltage is roughly equivalent to the peak RF voltage excursion. This assures that the PIN diode will be operated in the reverse bias area of its characteristic curve for the full extent of the swing of the input RF signal. Voltages of this magnitude generally require elaborate power supply design. This, in turn, typically requires large amounts of space, and, in addition, such large voltages are difficult to distribute throughout the typical equipment racks.

In a switching circuit embodying the present invention the signal available for transmission through a switch in a selected path is sampled and the sample is employed to place the switches in the unused paths in their high impedance state so as to block these paths. This approach eliminates the requirement for a power supply to provide the signal for placing the switches in the unused paths in their high impedance state.

The sole figure of the drawing is a schematic diagram of an antenna switching circuit in accordance with the present invention.

Referring now to the figure, an RF signal, supplied from, for example, a transmitter, is applied to the coaxial input port designated as "RF in ". It is desired to couple this RF signal to any one of several coaxial RF output ports, such as RF output port 1, 2, or, RF output port N. Each one of these RF output ports is connected to a corresponding antenna (not shown) such as antenna 1, 2... N. Thus, there are a plurality of circuit paths from the RF input port to the respective RF output ports.

The circuit in the figure may be thought of as including several similar sections such as Section 1, Section 2. . . Section N. Each section includes a main RF circuit path which electrically couples the RF output port to the RF input port. In addition, each section includes a bias control circuit. Since each of the sections are similarly arranged, the discussion will proceed with a detailed explanation of the operation of Section 1. It will be understood that the other sections operate in a similar manner.

In Section 1, the RF circuit path from RF output terminal 1 to the RF input terminal includes a PIN diode CR1 having its anode connected to one terminal of capacitor C2 and having its cathode connected to the RF input terminal. The other terminal of capacitor C2 is connected to the RF output terminal 1. The PIN diode CR1 functions as an RF switch. That is, when forward biasd it exhibits a very low impedance, on the order of less than one ohm at the low end of the HF frequency range. On the other hand, when PIN diode CR1 is reverse biased, it exhibits an impedance which is on the order of 10 Kohms. Capacitor C2 is a relatively small capacitor and it functions to block any DC signals which might otherwise appear at the RF output port 1.

The forward bias for PIN diode CR1 is applied from the control terminal for RF channel 1 through PNP transistor Q1, through resistor R5 and inductor L1 to the anode of CR1. Transistor Q1 is normally held in an off state. When it is desired to connect the RF input terminal to RF output terminal 1, a path selection control signal is applied to the control terminal for RF channel 1. This control terminal is normally held at $+5$ volts and when it is desired to forward bias PIN diode CR1, this 5 volt level is pulled down to 0 volts. Now, the 5 volts on the base is reduced in value to about 3.3 volts, placing transistor Q1 in a current conducting condition, and almost $+5$ volts appears at the junction between transistor Q1 and resistor R5. This voltage is coupled through inductor L1 to the anode of PIN diode CR1 to forward bias the PIN diode. The current conduction path from a DC point of view is from the collector of transistor Q1 through resistor R5, which is a relatively low impedance, through inductor L1, PIN diode CR1 and the DC return path through inductor L3 to ground. The resistor R6 having an impedance of 100 K ohms and the zener diode VR1, which requires a positive voltage greater than is available across capacitor C1 to conduct, prevents any significant flow of DC current other than in the direction of inductor L1. As long as the path selection signal is applied to the control terminal, the diode CR1 will be biased in the forward direction.

The RF signal now propagates from the RF input terminal through the PIN diode CR1 to the RF output terminal 1. A portion of the RF signal available at the RF input terminal is half-wave rectified by diode CR4 and zener diode VR2 in Section 2. This impresses a very large negative voltage, approximately equal to the peak excusion of the RF signal less the drops across the diodes CR4 and VR2, at one terminal of capacitor C4. Capacitor C4 and resistor R8 function to filter the rectified signal and the negative filtered voltage is applied to one end of inductor L2. Now, in the case of Section 2, the control transistor Q2 represents a very large impedance since no path selection control signal has been applied to the control terminal for RF channel 2. At this point, it should be noted that the system never wants to see two RF circuit paths activated simultaneously. Thus, as a result of the non-conductive condition of transistor Q2, there is very little drop in voltage across resistor R8 and hence, a large negative voltage on the order of $-325$ volts is impressed on the anode of PIN diode CR2. This reverse voltage biases PIN diode CR2 and blocks out the circuit path from the RF input port to the RF output port 2. In addition, all other circuit paths, such as circuit path N, are also blocked out.

Returning again to Section 1, the purpose of inductor L1 is to provide a DC path to the anode of pin diode CR1 while blocking any RF through this path. In addition, the purpose of the zener diode VR1 is to isolate the 5 volt DC supply from the rest of the RF circuitry going toward the RF input port. Thus, in the event of some element failure, there will be no large surge of DC current flowing through, for example, diode CR3 because VR1 requires at least +5 volts to conduct current toward CR3.

The overall operation of the switching circuit shown in the figure is as follows. An RF signal to be transmitted is applied to RF input terminal. All of the RF circuit paths in each of the Sections 1 through N are blocked. Now it is desired to enable one of the plurality of RF circuit paths. A path selection control signal is applied to one of the control terminals such as control terminal 1. Transistor Q1 turns on and a forward bias is applied to PIN diode CR1. At the same time the RF signal is being half-wave rectified in all of the non-selected channels such that a large negative voltage is being applied to the anodes of all of the PIN diodes in the non-selected paths. By virtue of the relative values of the resistors, such as R5 and R6, in combination with the impedance state of the control transistor, such as Q1, the forward biasing of a selected PIN diode through the application of the path selection control signal takes precedence over the reverse biasing through the half-wave rectifier. That is to say, by virtue of the relative values of the resistors such as R5 and R6 at 24 ohms and 100 K ohms respectively, in combination with the impedance value of the control transistor such as Q1, it turns out that when the control transistor is on there is a very large drop in voltage from one side of the 100 K ohm resistor to the other side. The drop is so large that the small negative voltage which might appear between resistors R5 and R6 is insufficient to overcome the forward biasing of the PIN diode CR1.

Thus, the present invention provides a switching circuit which employs semiconductor switching means in each of a plurality of circuit paths and wherein the provision of a high impedance blocking state for that switching means is accomplished in response to the RF signal, which is being applied at the RF input terminal, in all RF circuit paths other than the selected RF circuit path.

What is claimed is:

1. A switching circuit comprising:
    a plurality of circuit paths, each path coupling an input terminal to a different one of a plurality of output terminals, each of said paths including a switching means exhibiting a low impedance in response to a first control signal and a high impedance in response to a second control signal, each switching means including a PIN diode;
    control means coupled to each of said paths for supplying said first control signal to the switching means in a selected path;
    first means for supplying a source signal, to be passed through the selected path to the corresponding output terminal; and
    second means responsive to said source signal for supplying said second control signal to the switching means in all of said circuit paths other than said selected path, said second means including a plurality of rectifying devices, each rectifying device being electrically connected to a corresponding PIN diode and responsive to said source signal for supplying said second control signal to reverse bias said corresponding PIN diode other than the PIN diode in the selected path.

2. The circuit according to claim 1 wherein said control means comprises a plurality of transistor circuits, each circuit in said plurality being associated with a corresponding circuit path, a selected circuit being responsive to an applied path selection signal for supplying said first control signal to the PIN diode in the selected path for forward biasing the selected path PIN diode.

3. An RF switching circuit for connecting an RF input port to one of a plurality of RF output ports, said switching circuit comprising:
    a plurality of RF circuit paths, each path for coupling said RF input port to a different one of said RF output ports, each of said paths including a PIN diode;
    control means responsive to path selection control signals for forward biasing the PIN diode in a selected circuit path; and
    means responsive to an RF signal applied to said RF input port for reverse biasing the PIN diodes in the circuit paths other than said selected circuit path, said RF signal responsive means comprising:
    a plurality of rectifying diodes, each rectifying diode being electrically connected to a corresponding PIN diode;
    a plurality of voltage divider networks, each network being connected to a corresponding rectifying diode; and
    means for supplying a voltage from an intermediate point from each of said networks to the corresponding PIN diodes to reverse bias all of said PIN diodes other than the PIN diode/in the selected path.

4. The RF switching circuit according to claim 3 wherein each of said voltage divider networks includes a variable impedance means having an impedance value controlled by a path selection control signal applied to said control means.

5. The RF switching circuit according to claim 4 wherein said control means comprises a plurality of transistor circuits, each circuit in said plurality being associated with a corresponding circuit path, a selected transistor circuit being responsive to an applied path selection control signal to forward bias the PIN diode in the selected circuit path.

6. An RF switching circuit for coupling an RF input signal at an RF input port to one of a plurality of RF output ports, said switching circuit including a plurality of RF circuit paths coupling said RF input port to a different one of said plurality of RF output ports, each RF circuit path having an associated control circuit, each RF circuit path including a PIN diode connected in series between said RF input port and the associated RF output port, and wherein each control circuit comprises:
    a switching transistor having first and second main electrodes and a control electrode, the first main electrode being connected to a supply voltage and said control electrode being adapted to receive a path selection control signal;

first and second series connected resistors connected on one end to said second main electrode, the resistance value of the first resistor being much smaller than the resistance value of the second resistor;

a rectifying diode connected on one end to said RF input port and on the other end to the other end of said series connected resistors via a connection means; and an inductive coupling means connecting a point between said two resistors to a point in said circuit path on the RF output port side of said PIN diode;

whereby a path control selection signal applied to said control electrode causes a forward biasing signal to be applied to said PIN diode through said inductive coupling means and wherein said rectifying diode provides a signal coupled through said inductive coupling means to reverse bias said PIN diode in response to the presence of said RF signal at said RF input port and the absence of said path control selection signal.

7. An RF switching circuit according to claim 6 wherein said connection means comprises a zener diode.

8. A switching circuit comprising, in combination:

a plurality of paths, each extending between a common input terminal and a different one of a plurality of output terminals;

a plurality of switching means, one in each path, each capable of assuming a high or a low impedance condition;

means responsive to a path selection signal for placing the switching means in a path between the common input terminal and a selected output terminal in its low impedance condition, whereby that path is placed in a condition such that it can conduct a signal present at said input terminal to the selected output terminal;

a rectifier means connected to each path and responsive to the signal present at said common input terminal for producing a direct voltage control signal; and means for applying said direct voltage control signal to the switching means in the corresponding path for placing said switching means in all paths other than the one connected to the selected output terminal in its high impedance condition, whereby said non-selected paths operate as high impedance paths between said common input terminal and the non-selected output terminals.

9. A switching circuit as set forth in claim 8 wherein the switching means in each path comprises a PIN diode.

* * * * *